(12) United States Patent
Matsuoka et al.

(10) Patent No.: US 7,554,415 B2
(45) Date of Patent: Jun. 30, 2009

(54) MICROCOMPUTER INCLUDING A CR OSCILLATOR CIRCUIT

(75) Inventors: Toshihiko Matsuoka, Nukata-gun (JP); Hideaki Ishihara, Okazaki (JP)

(73) Assignee: DENSO CORPORATION, Kariya (JP)

( * ) Notice: Subject to any disclaimer, the term of this patent is extended or adjusted under 35 U.S.C. 154(b) by 109 days.

(21) Appl. No.: 11/640,876

(22) Filed: Dec. 19, 2006

(65) Prior Publication Data

US 2007/0164832 A1    Jul. 19, 2007

(30) Foreign Application Priority Data

Jan. 17, 2006    (JP) .............................. 2006-008633

(51) Int. Cl.
*H03B 5/24*    (2006.01)
*H03K 3/02*    (2006.01)
*H03L 1/02*    (2006.01)
*H03L 7/06*    (2006.01)

(52) U.S. Cl. ............................. 331/66; 331/18; 331/143

(58) Field of Classification Search ................. 331/1 A, 331/16, 18, 57, 65, 66, 68–70, 111, 143, 331/150, 175, 176

See application file for complete search history.

(56) References Cited

U.S. PATENT DOCUMENTS 4,563,748 A    1/1986    Hanaoka 5,604,468 A       2/1997 Gillig
2006/0113639 A1*  6/2006 Sutardja ................... 257/634

FOREIGN PATENT DOCUMENTS

| JP | A-50-1401247 | 11/1975 |
|----|----|----|
| JP | A-55-092041 | 7/1980 |
| JP | A-57-099039 | 6/1982 |
| JP | A-5-075445 | 3/1993 |
| JP | A-7-321644 | 12/1995 |
| JP | A-11-095857 | 4/1999 |
| JP | A-2000-323926 | 11/2000 |
| JP | A-2001-024486 | 1/2001 |
| JP | A-2002-050927 | 2/2002 |

* cited by examiner

*Primary Examiner*—David Mis
(74) *Attorney, Agent, or Firm*—Posz Law Group, PLC

(57) ABSTRACT

A microcomputer includes an oscillator for generating a clock signal having a frequency by using a CR circuit, a multiplier for outputting the clock signal having a multiplied frequency relative to the frequency generated by the oscillator based on data from an external source, a temperature detection unit for detecting temperature at a proximity of the CR circuit, a storage unit for storing data that enables the multiplied frequency of the clock signal in an output from the multiplier to have a constant value based on a temperature-dependent oscillation characteristic of the oscillator, and a control unit for setting a multiplication value for generating the multiplied frequency of the clock signal to the multiplier based on the data in the storage unit that is correlated to the temperature detected by the temperature detection unit.

5 Claims, 5 Drawing Sheets

MICROCOMPUTER INCLUDING A CR OSCILLATOR CIRCUIT

CROSS REFERENCE TO RELATED APPLICATION

This application is based on and claims the benefit of priority of Japanese Patent Application No. 2006-8633 filed on Jan. 17, 2006, the disclosure of which is incorporated herein by reference.

FIELD OF THE INVENTION

The present invention generally relates to a microcomputer having a CR oscillation circuit.

BACKGROUND OF THE INVENTION

In recent years, a conventional microcomputer uses a crystal oscillator for generating a clock signal. More practically, an oscillation circuit utilizing the crystal oscillator is used to generate a stable and accurate clock signal. However, the demand for decreasing a production cost of the microcomputer sometimes makes it necessary to substitute the crystal oscillator with a CR oscillator. In this case, an oscillation frequency of the CR oscillator is susceptible to temperature change of the environment, thereby causing an unstableness of the oscillation frequency. Therefore, processes in the microcomputer dependent on the output of the oscillation frequency of the CR oscillator is under an influence of frequency drift due to the temperature dependency of the oscillation frequency. In other words, the processes of the microcomputer may need to be corrected for having isochronal characteristics of execution time when the processes are critically dependent on the oscillation frequency of the CR oscillator.

For example, Japanese patent document JP-A-H05-75445 discloses a technique for maintaining a stable oscillation frequency. That is, the CR oscillator stores a standard oscillation frequency in an EEPROM based on a measurement on a standard measurement condition of an environment that includes a predetermined power source voltage and a predetermined temperature, and utilizes the stored relationship between the frequency and the condition for compensating a current oscillation frequency based on a current measurement of the power source voltage and temperature.

This compensation scheme described above works in the following manner. That is, the oscillation frequency of the CR oscillator is compensated by adjusting a register value for decrement operation in a loop program for time generation to have an appropriate number of loops for, for example, a wait time of 1 ms.

However, the technique described above has a problem when the loop time of a time generation program and/or a base loop time of application programs are under influence of the environmental change. That is, the technique is not applicable to the condition that is susceptible to the environmental change when the loop time is not supposed to change. Further, the throughput of processing of the software, e.g., an execution interval between instructions, an execution time or the like, suffers from the change of the loop time, thereby restricting application of the loop program only to the time generation. Furthermore, a hardware sequencer that implements the above-described process is susceptible to the same problem of fluctuating sequence process time.

SUMMARY OF THE INVENTION

In view of the above-described and other problems, the present disclosure provides a microcomputer that provides compensation of an oscillation frequency for having a stable clock signal generated by a CR oscillator when an environmental condition including temperature is not stable.

In one aspect of the present disclosure, a microcomputer includes an oscillator for generating a clock signal having a frequency by using a CR circuit, a multiplier for outputting the clock signal having a multiplied frequency relative to the frequency generated by the oscillator based on data from an external source, a temperature detection unit for detecting temperature at a proximity of the CR circuit, a storage unit for storing data that enables the multiplied frequency of the clock signal in an output from the multiplier to have a constant value based on a temperature-dependent oscillation characteristic of the oscillator, and a control unit for setting a multiplication value for generating the multiplied frequency of the clock signal to the multiplier based on the data in the storage unit that is correlated to the temperature detected by the temperature detection unit. In this manner, the clock signal has a stable frequency according to compensation data set by the control unit even when the frequency of the clock signal from the oscillator drifts under an influence of a change in the temperature. Therefore, a process time of certain software or a certain hardware sequencer based on the clock signal from a CR oscillator is kept at a certain value. As a result, the process time or a portion of the process time is utilized by a different process that requires a fixed amount of time as a standard period.

In another aspect of the present disclosure, the data in the storage unit is an approximation of an output of the temperature-dependent oscillation characteristic of the oscillator represented by a quadratic curve. In this manner, the frequency of the clock signal after processing by the multiplier is accurately maintained at a constant value.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

Embodiments of the present invention are described with reference to the drawings. Like parts have like numbers in each of the embodiments.

Figure 6:
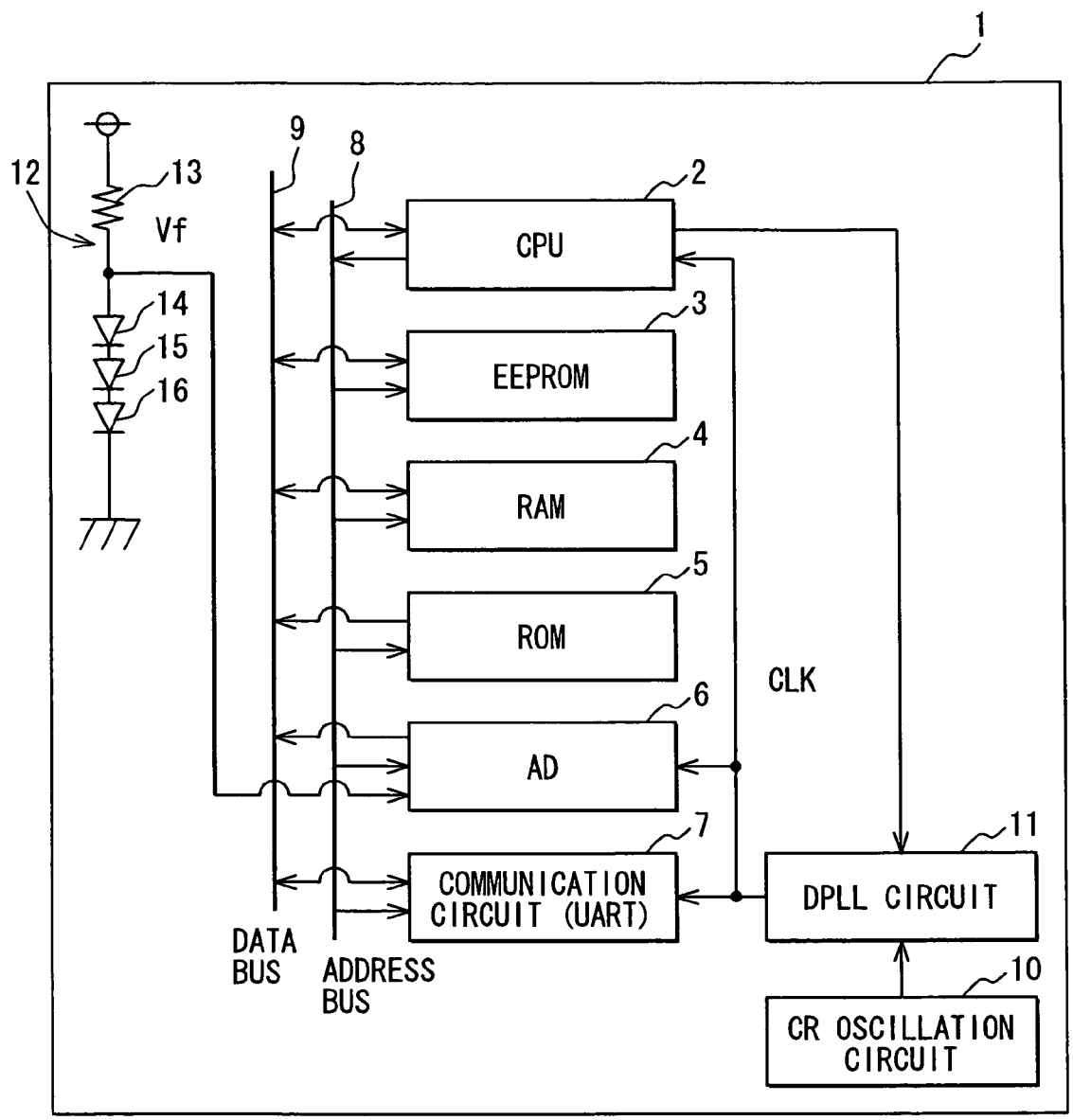
FIG. 6 shows a block diagram of a microcomputer.

FIG. 6 shows a block diagram of a microcomputer 1 used in an embodiment of the present disclosure. The microcomputer 1 includes CPU (control circuit) 2, EEPROM 3, RAM 4, ROM 5, A/D converter 6, and a communication circuit 7 (e.g., UART(Universal Asynchronous Receiver Transmitter)), and these components are interconnected with each other through an address bus 8 and a data bus 9. A system clock signal CLK is generated by a CR oscillator 10, is multiplied by a DPLL (Digital Phase Lock Loop) circuit 11, and is provided for the CPU 2, the A/D converter 6, and the communication circuit 7.

The microcomputer 1 further includes a temperature detection circuit 12. The temperature detection circuit 12 is a series circuit that couples a power source and a ground with a resistor 13, diodes 14, 15, 16 (in a regular connection order). A common connection point between the resistor 13 and the diode 14 is also connected to an analog port of the A/D converter 6. That is, a divided voltage Vf at the common connection point is susceptible to temperature change based on the temperature characteristics of the diodes 14 to 16. The circuits and components described above are disposed on a single substrate, and the microcomputer 1 is a one-chip element.

Figure 7:
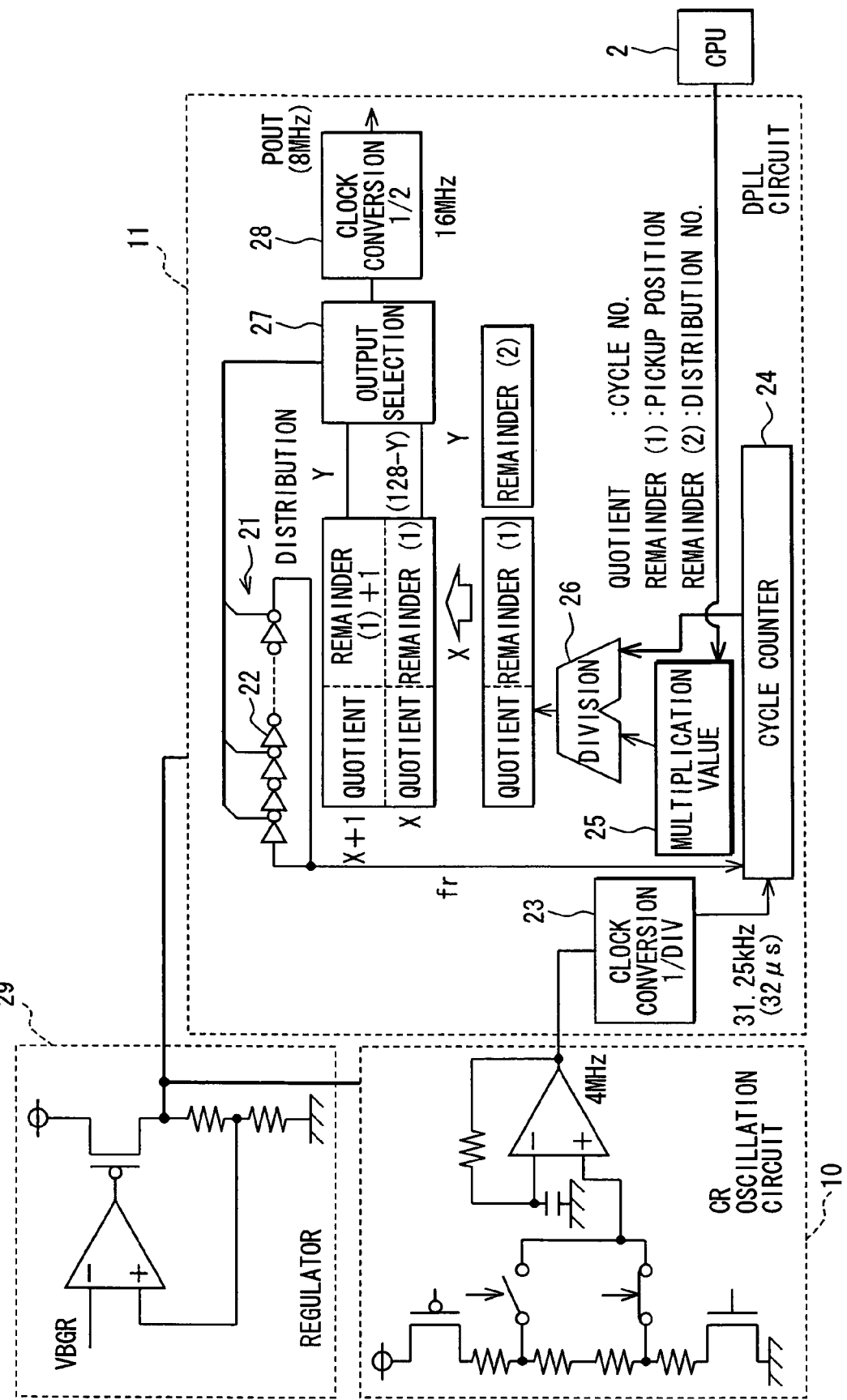
FIG. 7 shows a block diagram of DPLL circuit that is coupled with a regulator and a CR oscillation circuit.

FIG. 7 shows a block diagram of the DPLL circuit 11 that is coupled with a regulator 29 and the CR oscillator 10. The DPLL circuit 11 includes a ring oscillator 21. The ring oscillator 21 is an oscillator that connects plural delay gates, that is, for example, INV (Inverter) gates 22, in a ring form for digitally generating a high speed clock signal based on an oscillation. The ring oscillator 21 may be constructed in the following manner. For example, when the INV gates 22 having a transmission delay time of 153 ps (pico seconds) in two steps are connected in a series of 32 pieces, high and low of the voltage are inversed in a cycle of 2.45 ns (nano seconds) (=153 ps multiplied by 16). Therefore, a high frequency clock signal fr having a cycle of 4.9 ns (=2.45 ns multiplied by 2) is generated in the ring oscillator 21 in this case.

The DPLL circuit 11 is provided with a clock signal of 4 MHz (a standard frequency) from the CR oscillator 10, and uses, for example, a standard clock signal of 31.25 kHz (cycle time: 32 μs) that is derived by dividing the standard frequency with a factor of 128 by using an internal clock conversion circuit 23. The number of cycles of the standard clock signal is counted by a cycle counter 24 in comparison with the high speed clock signal fr of the ring oscillator 21. Count data of the cycle counter 24 is divided in the CPU 2 by using a divider 26 with a factor in association with a value stored in a multiplication value register 25.

The division operation by the divider 26 yields a quotient and a remainder. Then, the ring oscillator 21 is used to output 16 counts of pulse edges from every other output terminals of the INV gates 22. The 16 counts of pulse edges have phase differences of one sixteenth of the high speed clock signal fr with each other. The pulse edges are selected by an output selection unit 27 for setting an output timing of multiplied clock signal. In this manner, the high speed clock signal fr acquires a resolution power of 4 bits.

Therefore, when the number of bits for storing the remainder is 11, higher four bits of the remainder, i.e., a remainder 1 represented by X, with lower seven bits of the remainder, i.e., a remainder 2 represented by Y, are used for count down calculation of the quotient stored in a down counter by the high speed clock signal fr. When the value of the count down reaches zero, the output timing of one of the 16 pulse edges is selected for generating the multiplied clock signal.

After outputting the multiplied clock signal for (128−Y) times based on the output timing described above, the multiplied clock signal based on the selection of the pulse edge by the factor (X+1) is outputted for Y times. As a result, the output timing of the multiplied clock signal that has a finer granularity than the phase difference between the 16 pulse edges (i.e., 153 ps) is equivalently represented by using the lower seven bits of the remainder (the remainder 2 represented by Y) for finer resolution powers.

In the diagram in FIG. 7, the standard clock signal is multiplied by 512 for generating the clock signal having the frequency of 16 MHz, and the multiplied clock signal of 8 MHz (POUT, corresponding to CLK in FIG. 6) is generated by dividing the frequency of 16 MHz by 2 with the clock conversion circuit 28 in an output step before output for wave rectification purpose. Further, for the CR oscillator 10 and the DPLL circuit 11, a constant power supply is provided from the regulator 29 based on a band gap reference voltage (VBGR).

The effect of the present embodiment is described with reference to FIGS. 1, 5, and 7. The frequency of the system clock signal CLK from the CR oscillator 10 changes depending on the temperature as described above. Because a communication speed, i.e., a baud rate, of the communication circuit 7 is determined based on the system clock signal CLK, a communication rate fluctuates according to the change of the system clock signal CLK. Therefore, a time required for the communication circuit 7 to transfer one frame of data also fluctuates.

The present embodiment of the disclosure adjusts the multiplication value of the DPLL circuit 11 so that the frequency of the multiplied clock signal generated by the DPLL circuit 11 is stable even when the oscillation frequency of the CR oscillator 10 fluctuates due to the temperature change. The compensation data for the adjustment is prepared in advance and stored in the EEPROM 3. In this manner, the multiplication value of the DPLL circuit 11 is adjusted on demand based on the compensation data stored in the EEPROM 3 while the microcomputer 1 is operating.

Figure 4:
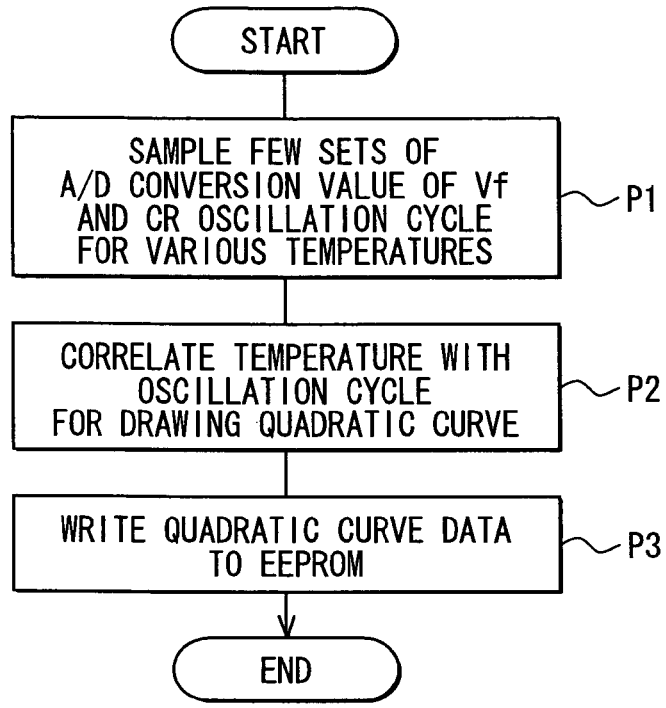
FIG. 4 shows a flow chart of an EEPROM writing process.

FIG. 4 shows a flow chart of an EEPROM writing process that is performed for storing the compensation data before the microcomputer 1 is shipped. The process works in the following manner.

In step P1, the process takes measurements of the output from the temperature detection circuit 12 for recording an A/D conversion value of the detected divided voltage Vf and an oscillation cycle (or frequency) of the CR oscillator 10 by using various values of sampling temperature that control the operation environment of the microcomputer 1.

Figure 5:
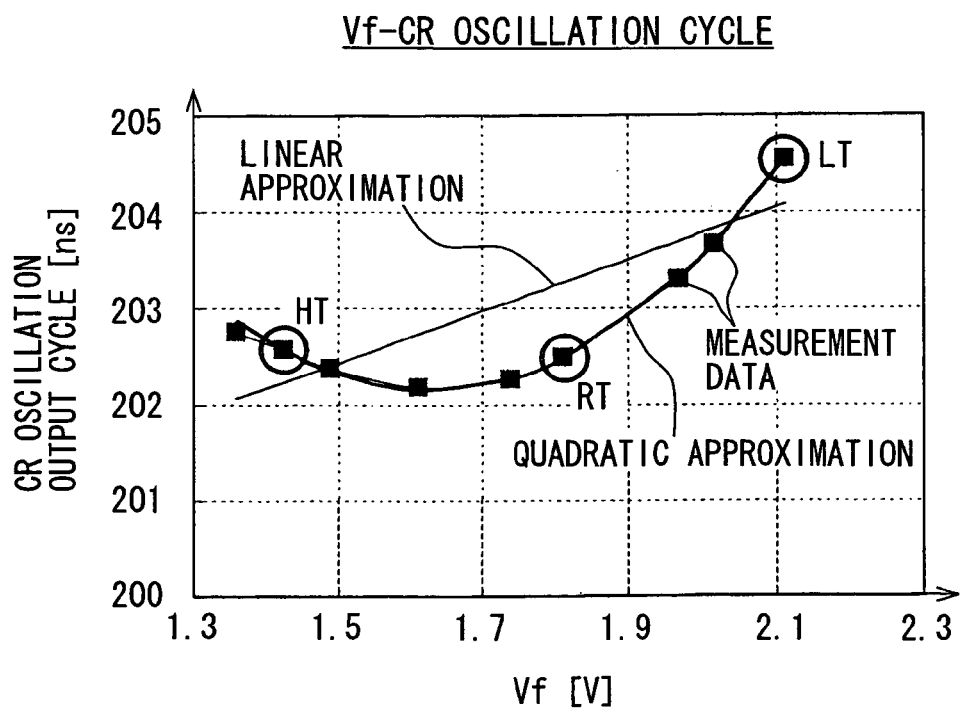
FIG. 5 shows a diagram of approximation of detection voltage and oscillation output cycle.

In step P2, the process plots an approximated quadratic curve based on three measurements of the A/D conversion value of the voltage Vf and the oscillation cycles of LT, RT, and HT of he CR oscillator 10 at, for example, the temperature of −40, 25, and 125 Celsius as shown in FIG. 5.

In step P3, the process stores a function of the quadratic curve (the compensation data for approximation) in the EEPROM 3.

Figure 1:
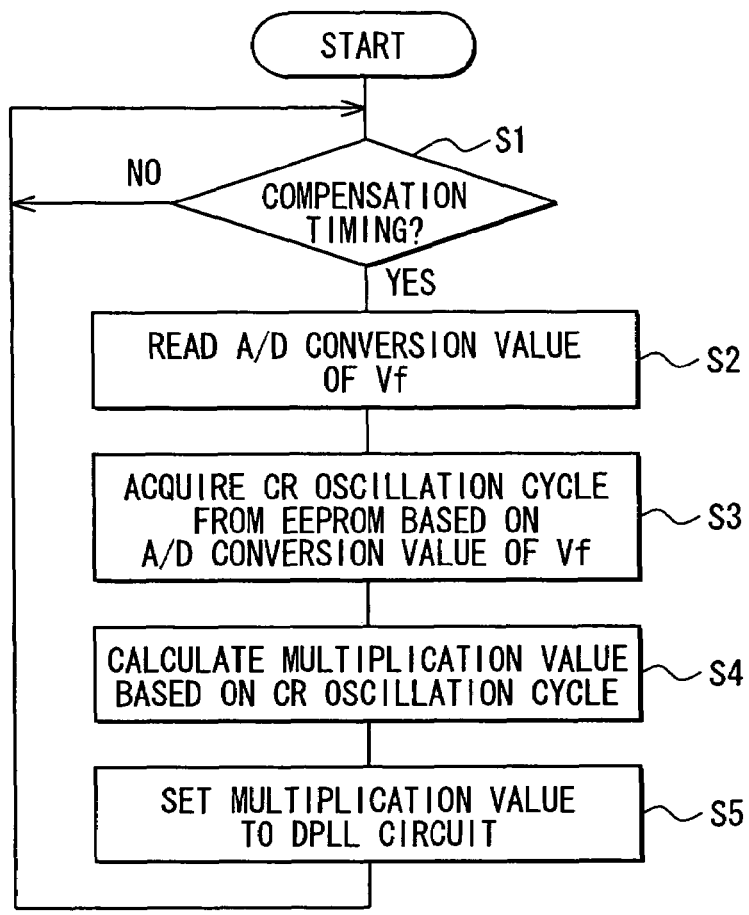
FIG. 1 shows a flow chart of a clock signal compensation process in a CPU of a microcomputer in an embodiment of the present disclosure.

FIG. 1 shows a flow chart of a clock signal frequency compensation process in the CPU 2 of the microcomputer 1 in the present embodiment.

Figure 2:
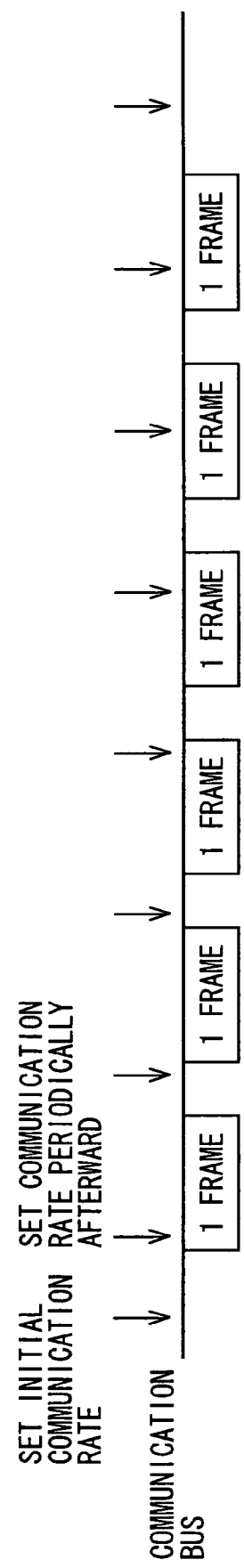
FIG. 2 shows a sequence diagram of compensation timing.

The process in the CPU 2 periodically performs the compensation described above at a predetermined interval as described in step S1. The process proceeds to step S2 when the compensation is performed (step S1 :YES). The process otherwise repeats itself (step S1:NO). FIG. 2 shows an example of the compensation timing. The compensation cycle is not necessarily in synchronization with the timing of the data transfer.

In step S2, the process reads the A/D conversion value of the detected divided voltage Vf from the A/D converter 6.

In step S3, the process acquires the oscillation cycle data of the CR oscillator 10 that corresponds to the A/D conversion value.

In step S4, the process calculates the multiplication value for having a stable frequency of the multiplied clock signal (e.g., 8 MHz) based on the acquired oscillation cycle.

In step S5, the process sets the multiplication value derived from the above calculation by writing it to the multiplication value register 25 in the DPLL circuit 11. The process returns to step S1 after writing the multiplication value.

When the clock frequency of the CR oscillator 10 is 4 MHz, the clock frequency is kept stable based on the multiplied clock signal of 8 MHz that is derived by multiplication of 512 times after division by 128 followed by a subsequent step of division by 2. That is, a constant frequency value of the multiplied clock signal is generated by making adjustment to the multiplication value of 512 according to the fluctuation of the oscillation frequency of the CR oscillator 10. Therefore, the communication speed of the communication circuit 7 is kept at a stable value.

Figure 3:
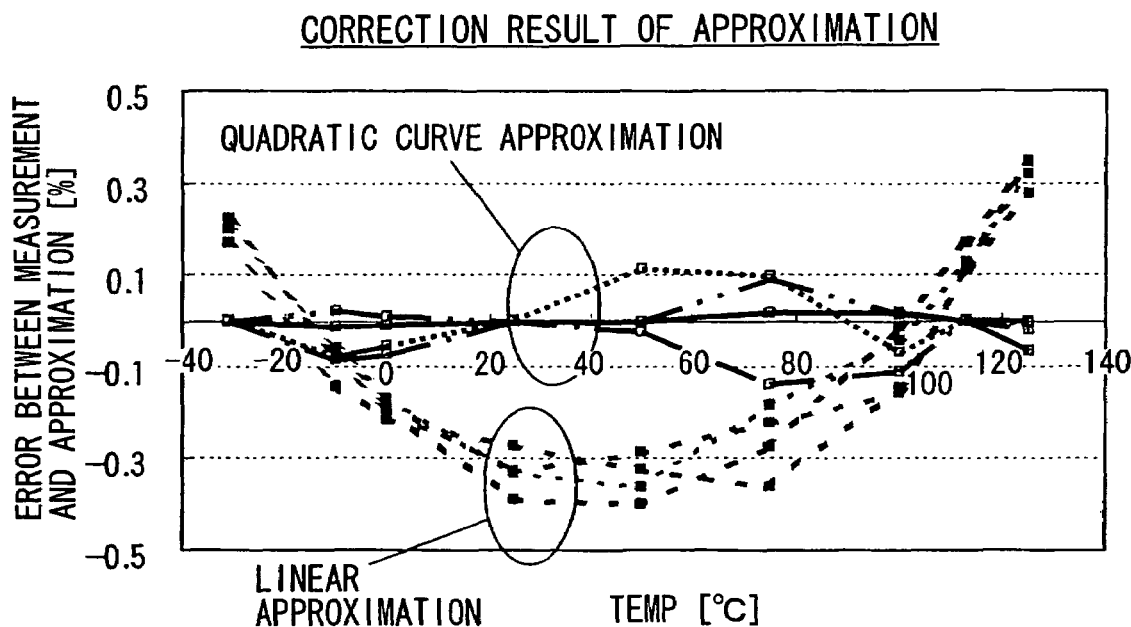
FIG. 3 shows a diagram of approximation of relationship between temperature and compensation error.

FIG. 3 shows a diagram of approximation of the relationship between the detected temperature and compensation error. That is, the error between the approximated quadratic curve of the temperature characteristics of the CR oscillator 10 and an actual oscillation frequency is plotted in the diagram in FIG. 3. A linear approximation of the temperature characteristics is also shown for comparison purpose. The error in the approximation by the quadratic curve is around 0.1%, while the error in the linear approximation is around 0.4%.

In the present embodiment described above, the oscillation cycle data of the CR oscillator 10 under the influence of the temperature is stored in the EEPROM 3 in the microcomputer 1, and the multiplication value for the DPLL circuit 11 is determined based on the detected temperature by the temperature detection circuit 12 that is under control of the CPU 2 and the data stored in the EEPROM 3.

In this manner, the data transfer time by the communication circuit 7 is kept at a constant value that is derived from the stable value of the multiplied clock signal even when the oscillation frequency of the CR oscillator 10 fluctuates due to the temperature change. In addition, the transfer time of one frame of data is accurately controlled at a stable value after compensation in the above described scheme of the present embodiment for a preferred condition of communication process between both ends of the transfer in synchronization with each other. Furthermore, a stable data transfer time in the communication process is provided by a periodic compensation of the multiplied clock signal by the CPU 2 in the present embodiment.

Although the present invention has been fully described in connection with the preferred embodiment thereof with reference to the accompanying drawings, it is to be noted that various changes and modifications will become apparent to those skilled in the art.

For example, the linear approximation data of the frequency output from the CR oscillator 10 may be stored in the EEPROM 3 depending on the required accuracy in the communication process. In that case, only the inclination and the intercept of the linear approximation may be stored for the calculation of the oscillation cycle.

The EEPROM 3 may store the relationship between a standard value of the temperature that corresponds to the standard oscillation frequency of the CR oscillator 10 and the multiplication value data for correcting and compensating the deviation of the temperature from the standard value for use in the calculation of the multiplication value.

The EEPROM 3 may also store the multiplication value in correlation with the temperature for compensation calculation.

The temperature for taking a measurement of the oscillation cycle may be arbitrarily determined depending on the application software of interest.

The compensation process may be performed in synchronization with the communication process, or may be performed on a timing of a specific event. For example, the compensation process may be performed at a start of the data transfer for only once.

The compensation process may be applied to a process other than the process in the communication circuit 7 as long as the process is involved in a periodic event processing based on the timer interruption count generated by the output from the CR oscillator 10.

The multiplication circuit may be provided as an analog PLL circuit. For example, the temperature is detected by using plural temperature detection circuit around the CR oscillator 10 for having the average of the output from those circuits.

The temperature detection circuit 12 may be composed by any circuit that detects the temperature of the circuit of interest.

Such changes and modifications are to be understood as being within the scope of the present invention as defined by the appended claims.

What is claimed is:

1. A microcomputer comprising:
   an oscillator for generating a clock signal having a frequency by using a CR circuit;
   a multiplier for outputting the clock signal having a multiplied frequency relative to the frequency generated by the oscillator based on data from an external source;
   a temperature detection unit for detecting temperature at a proximity of the CR circuit;
   a storage unit for storing data that enables the multiplied frequency of the clock signal in an output from the multiplier to have a constant value based on a temperature-dependent oscillation characteristic of the oscillator; and
   a control unit for setting a multiplication value for generating the multiplied frequency of the clock signal to the multiplier based on the data in the storage unit that is correlated to the temperature detected by the temperature detection unit,
   wherein the data in the storage unit is an approximation of an output of the temperature-dependent oscillation characteristic of the oscillator represented by a quadratic curve.

2. The microcomputer as in claim 1, wherein the temperature detecting unit comprises:
   a power source;
   a plurality of diodes arranged in series and connected at a first end to a ground potential; and
   a resistor connected between the power source and a second end of the plurality of diodes arranged in series.

3. The microcomputer as in claim 1,
   wherein the temperature detecting unit further comprises an analog-to-digital converter configured to convert a reference voltage at the second end of the plurality of diodes arranged in series from an analog value to a digital value, and
   wherein the control unit uses the digital value to generate the multiplied frequency of the clock signal to the multiplier based on the data in the storage unit.

4. The microcomputer as in claim 1, wherein the storage unit is an electrically erasable programmable read-only memory.

5. The microcomputer as in claim 1, wherein the oscillator, the multiplier, the temperature detection unit, the storage unit, and the control unit are all formed on a single substrate.

* * * * *